United States Patent
Yeh et al.

(10) Patent No.: US 6,812,158 B1
(45) Date of Patent: Nov. 2, 2004

(54) MODULAR GROWTH OF MULTIPLE GATE OXIDES

(75) Inventors: Wen-Chin Yeh, Fremont, CA (US); Venkatesh Gopinath, Fremont, CA (US); Arvind Kamath, Mountain View, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/335,177

(22) Filed: Dec. 31, 2002

(51) Int. Cl.[7] .......................... H01L 21/31; H01I 29/76
(52) U.S. Cl. ................ 438/770; 438/275; 438/981; 438/787; 257/391; 257/392
(58) Field of Search ................ 438/275, 981, 438/216, 770, 775, 787; 257/333, 339, 390, 391, 392

(56) References Cited

U.S. PATENT DOCUMENTS

| | | | | |
|---|---|---|---|---|
| 5,672,521 A | * | 9/1997 | Barsan et al. | 438/981 |
| 6,133,164 A | * | 10/2000 | Kim | 438/275 |
| 6,165,849 A | * | 12/2000 | An et al. | 438/275 |
| 6,258,673 B1 | * | 7/2001 | Houlihan et al. | 438/275 |
| 6,339,448 B1 | * | 1/2002 | Patrick | 348/143 |
| 6,551,884 B2 | * | 4/2003 | Masuoka | 438/275 |
| 6,602,751 B2 | * | 8/2003 | Oohashi | 438/275 |

OTHER PUBLICATIONS

Y. Goto et al., "A Triple Gate Oxide CMOS Technology Using Fluorine Implant for System–on–a Chip", IEEE 2000 Symposium on VLSI Technology Digest of Technical Papers, 0–7803–6308–6, 2000, 2 pages.

L.K. Han et al., "A Modular 0.13 µm Bulk CMOS Technology for High Performance and Low Power Applications", IEEE 2000 Symposium on VLSI Technology Digest of Technical Papers, 0–7803–6308–6, 2000, 2 pages.

C.H. Lee et al., "A Manufacturable Multiple Gate Oxynitride Thickness Technology for System on a Chip", IDEM, vol. 99, pp 491–494, 1999.

C.T. Liu et al., "Multiple Oxide Thickness for 2GHz System–on–A–Chip Technologies", IEDM, vol. 98, pp 589–592, 1998.

M. Togo et al., "Multiple–Thickness Gate Oxide and Dual–Gate Technologies for High–Performance Logic Embedded DRAMs", IEDM, vol. 98. pp 347–350, 1998.

* cited by examiner

Primary Examiner—Kevin M. Picardat
(74) Attorney, Agent, or Firm—Beyer Weaver & Thomas, LLP

(57) ABSTRACT

Growth of multiple gate oxides. By implanting different sites of a wafer with different doses of an oxide growth retardant, the entire wafer can grow oxides of different thicknesses even after being exposed to the same oxidation environment. The process is modular insofar as the implantation of one site has no effect on rate of growth of other sites.

17 Claims, 10 Drawing Sheets

MODULAR GROWTH OF MULTIPLE GATE OXIDES

TECHNICAL FIELD

The invention described herein relates generally to semiconductor fabrication, and more particularly to gate oxide fabrication on semiconductor substrates.

BACKGROUND

A gate oxide is a dielectric layer of oxide sandwiched between a transistor's semiconductor channel portion and the gate portion. As the distance between the gate and channel decreases, the transistor's switching speed increases. However, if the gate oxide is too thin for a given channel length at a certain voltage, the electric field across the gate oxide will become excessive and results in leakage or a short. Therefore, different channel lengths require different thicknesses of gate oxides to operate properly at different voltages.

For example, 0.35 μm CMOS technology uses gate oxide around 60 to 70 Å and power supply of about 3.3V, 0.25 μm technology uses gate oxide between about 45 to 55 Å and a power supply of about 2.5V, 0.18 μm technology uses gate oxide around 28 to 34 Å with power supply of about 1.8V, and 0.09 μm technology is expected to use gate oxide from about 14 to 16 Å and a power supply of about 1V. Each of these technologies represents a generational node, a shift in the relevant standards to a smaller and faster transistor.

However, in each of these generations there is typically a need for system-on-chip (SOC) applications to include CMOS transistors from previous generational nodes. For example, many of the 0.09 μm node devices also require CMOS transistors designed for intended operation at 1.8V, 2.5V and 3.3 V. Other 0.09 μm node devices might require only two or three combinations of previous CMOS transistors. Therefore, there is a need for multiple gate oxides on the same chip to enable the combinations of transistors from different technology node.

A commonly used method of growing multiple gate oxides is to perform sequential oxidations and cleans. With each sequential clean and oxidation, a gate oxide can be grown with intended thickness. By repeating the process N times, N number of gate oxides can be grown. Since the oxidation is additive, each oxidation following a previous one will add some thickness to the existing ones. Adjustment of oxidation has to be made to make sure each desired thickness is obtained. Since the oxidation involves temperature and time, the choice of oxide combination requires an oxidation sequence to be developed and tailored for such combination. A different combination of gate oxides requires a different oxidation process sequence and the transistors built on these oxides will be affected because of the different set of thermal cycles seen.

For example, if there were three oxide targets at 16 Å, 28 Å and 64 Å, oxide would need to be grown three times. After the semiconductor substrate is properly prepared (i.e., pre-cleaned), the thickest oxide is grown to about 58 Å at 850° C. with a $N_2$ anneal. After that oxide is grown, the areas where the thickest and thinnest oxides are desired would be masked. A hydrofluoric acid etch would then be performed on the areas where the medium oxide thickness is desired, removing all oxide from the target areas.

Using a low thermal budget oxidation step, the second oxidation growth could be grown to about 22 Å at 700° C. Although the medium oxide targets would have 22 Å of oxide, the thickest oxide would remain at approximately 58 Å. Another resist masking step would then be performed on only the thin oxide area, masking the thick and medium targets. After removing the oxide in the exposed area, and followed by resist strip, the third and final oxidation growth at 800° C. in NO or oxidation ambient could then be designed to grow 16 Å on the thin target, and additional 6 Å on the medium target and an additional 4 Å on the thick target, making the final oxide growths 16 Å, 28 Å and 64 Å

This series of masks, cleans and oxidations can theoretically achieve any number of oxides on the chip, as long as the additive oxidations are properly calculated. However, the oxides that are grown earlier in the sequence will see several masking and mask removal steps, which potentially causes defects like pinholes and chemical contamination.

Additionally, the above method is not seamlessly modular. Omitting any single oxide affects all other transistors built on the other oxides. The impurities that control device behavior see different thermal cycles and have different concentration profiles depending on the choice of the number of oxides required on the chip. Achieving electrical modularity between common devices formed on a subset of the complete flow would require a combination of dummy thermal cycles (mimicking the omitted oxidation steps) and compensating impurity implants to correct transistor behavior, all of which would lead to a multiplicity of fabrication flows in the manufacturing facility and create the possibility of incorrect processing.

SUMMARY OF THE INVENTION

The present invention provides a technique for growing multiple oxides. In one embodiment, oxides are grown by first implanting a first portion of the semiconductor substrate with a first dose of an oxide growth retardant, implanting a second portion of the semiconductor substrate with a second dose of an oxide growth retardant, and lastly oxidizing the semiconductor substrate in a first environment to grow a first oxide on the first portion and a second oxide on the second portion. Usually, a third portion of the semiconductor substrate is not implanted with any oxide growth retardant so that a third oxide is grown on the third portion during oxidation. The third oxide is the thickest of the three.

The oxidation environment may not be sufficient to grow certain oxides of very thin thicknesses. If this is the case, then a second oxidation may be required. For example, if a thinner oxide were desired, then oxide would be selectively removed through masking and etch process from some part of the third portion of the semiconductor substrate. This would expose an substrate area, allowing the second oxidation to grow a new oxide on that exposed area at a normal unretarded rate. However, since oxidation takes place on the entire semiconductor substrate, a first additional oxide would also be grown on the first portion and a second additional oxide would be grown on the second portion. If there were some remaining part of the third oxide that was not removed, then a third additional oxide would also be grown on that remaining part of the third portion during the second oxidation. After second oxidation, four oxides of different thickness are present on the substrate. Alternatively, a masking step can be applied to selectively expose any of the oxide area. Then a controlled wet etch can be used to thin the exposed oxide to desired thickness. The resist strip and clean will follow. This will create a thinnest fourth oxide without using the second oxidation.

The process is inherently modular. In another embodiment, a first oxidation environment is initially selected. Then, a determination is made as to whether oxides of a first thickness are required on a first portion of the semiconductor substrate. If oxides of the first thickness are required, then the semiconductor substrate is masked so that the first portion is exposed. Then, the exposed first portion is implanted with a first dose of oxide growth retardant, the first dose being appropriate for the first oxidation environment and the first thickness. The mask material is then removed.

After the first determination, another determination is made. Specifically, a determination is made as to whether oxides of a second thickness are required on a second portion of the semiconductor substrate. If oxides of the second thickness are required, then the semiconductor substrate is masked so that the second portion is exposed. Then the exposed second portion is implanted with a second dose of an oxide growth retardant, the second dose being appropriate for the first oxidation environment and the second thickness. The mask material is then removed Regardless of the results of the thickness determinations and whether additional determinations are made, the semiconductor substrate is then oxidized at the first oxidation environment. Whether one section is implanted has no relevance to the oxide growth of other sections.

Yet another embodiment is of a semiconductor wafer. The wafer comprises a plurality of transistors formed in between adjacent isolation trenches. The transistors are one of at least three different lengths, and each transistor having a different oxide thickness appropriate to the channel's length and operating voltage. However, the number of oxidations that the wafer has been subjected to is fewer than the number of different oxide thicknesses.

BRIEF DESCRIPTION OF THE DRAWINGS

The following detailed description will be more readily understood in conjunction with the accompanying drawings, in which.

It is to be understood that, in the drawings, like reference numerals designate like structural elements. Also, it is understood that the depictions in the figures are not necessarily to scale.

DETAILED DESCRIPTION OF THE DRAWINGS

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

Figure 1A:
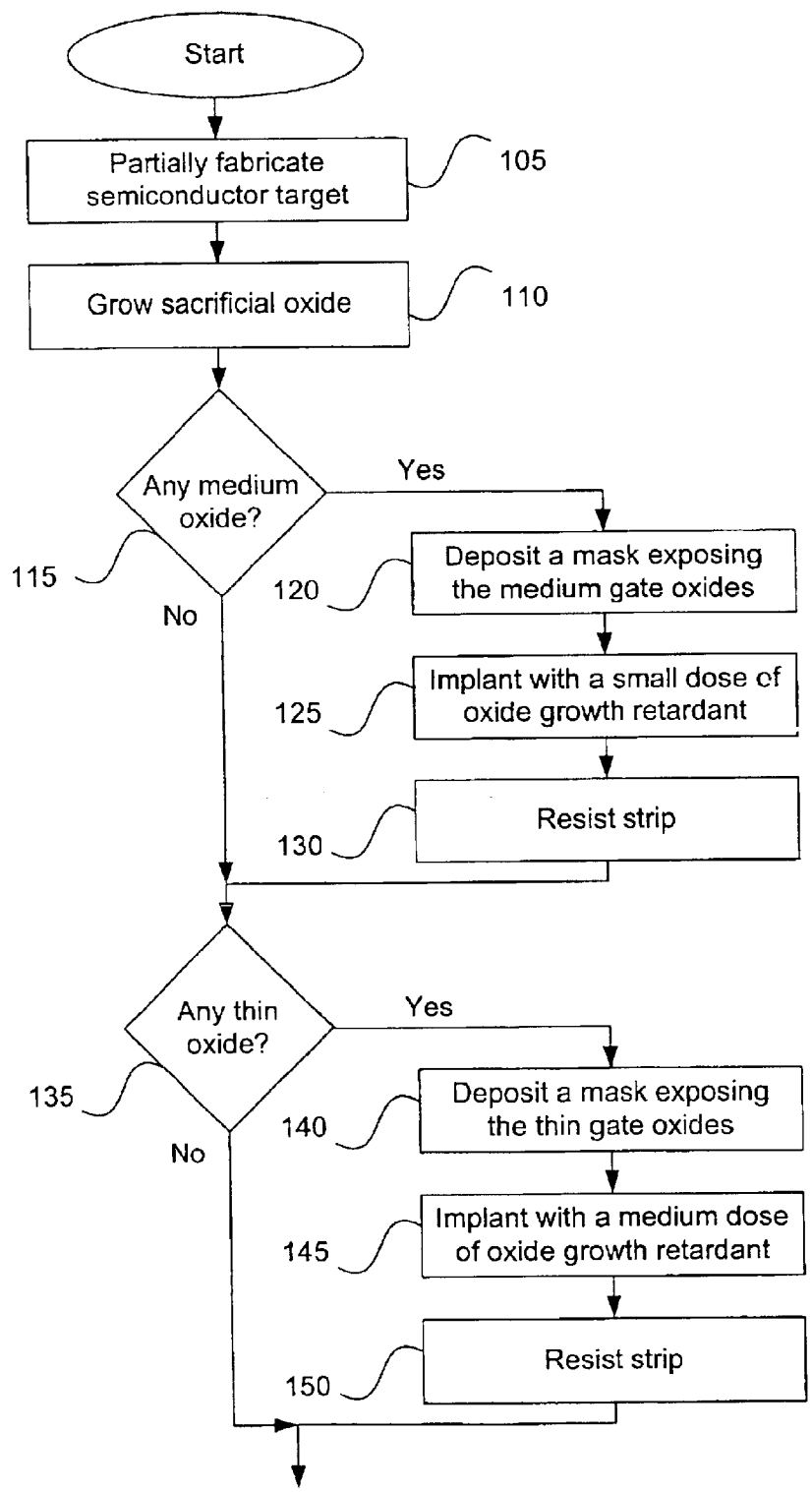
FIGS. 1A and 1B are flowcharts of a fabrication process that allows multiple thicknesses of gate oxides to be grown on a semiconductor substrate.
Figure 1B:
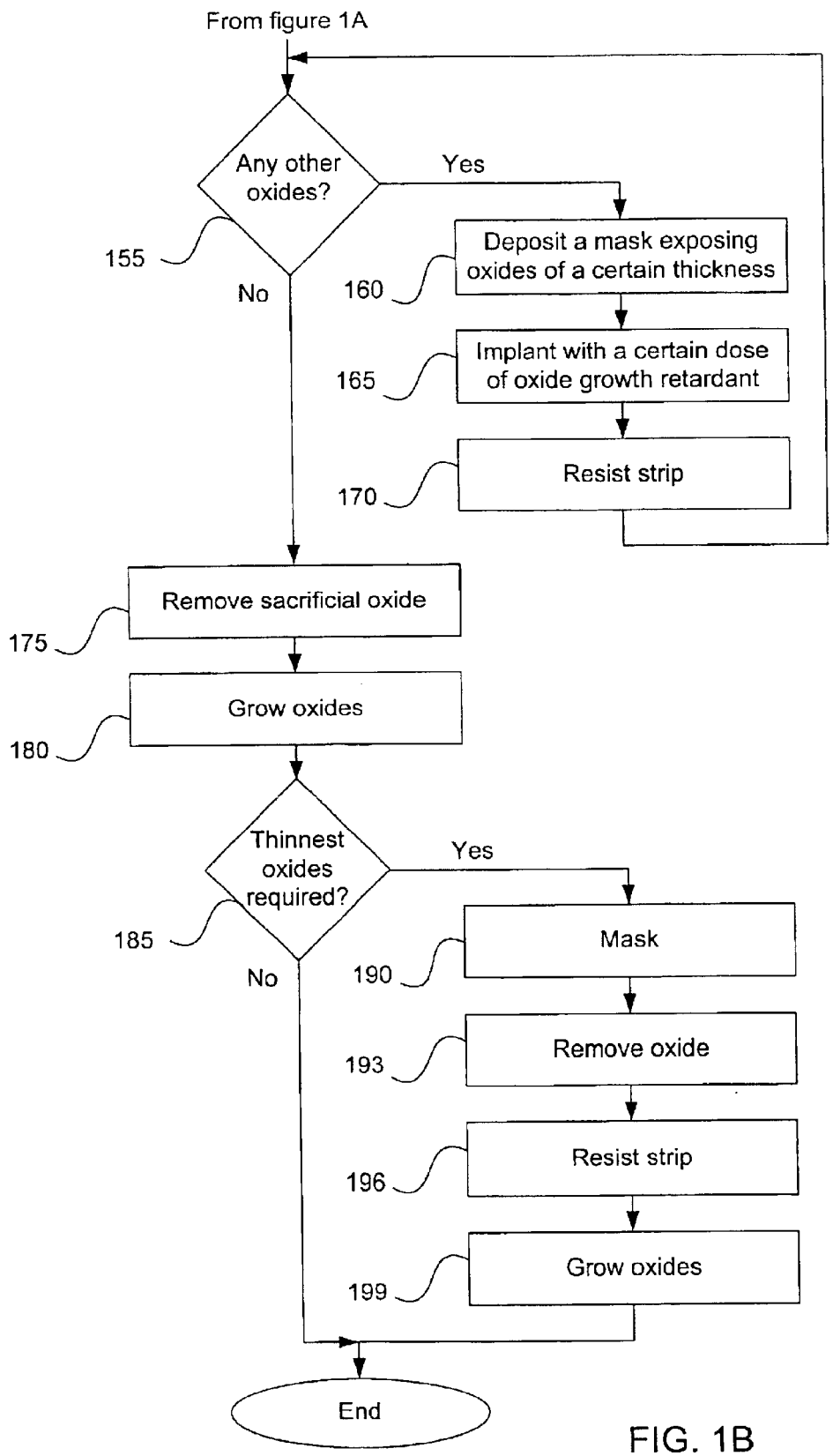

FIGS. 1A and 1B are flowcharts of a fabrication process that allows multiple thicknesses of gate oxides to be grown on a semiconductor substrate. At 105, a semiconductor substrate is partially fabricated. Standard processing techniques can be used to form appropriately doped wells at appropriate locations on the substrate.

Figure 2:
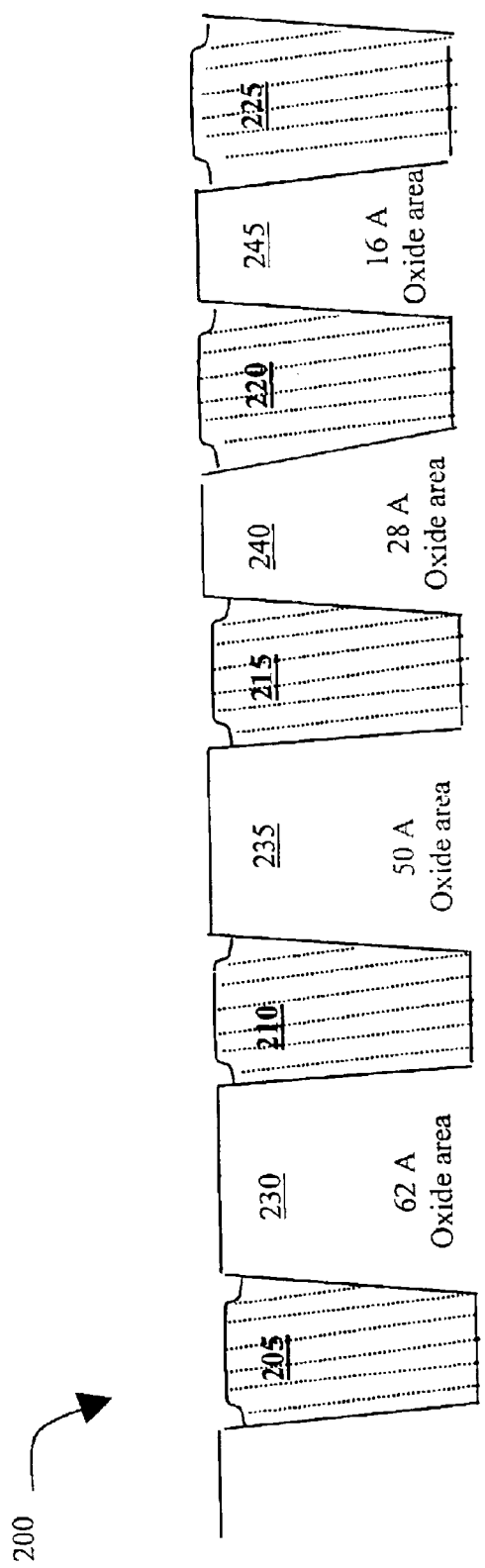
FIG. 2 is a cross-sectional view of an exemplary partially fabricated wafer.

FIG. 2 is a cross-sectional view of an exemplary partially fabricated wafer 200 in which five filled isolation trenches 205, 210,215, 220, and 225 define four different islands (or active areas) 230, 235, 240, and 245 where different technology node transistors operating at different operating voltages (Vdd) can be formed.

Each transistor formed in areas of 230, 235, 240 and 245 can potentially represent a device of a different generational node Because of the different Vdd, each island of 230, 235, 240 and 245 requires a different gate oxide thickness. The highest Vdd transistor built in 230 requires about 62 Å of oxide, the medium Vdd transistor in 235 requires about 50 Å, the low Vdd transistor in 240 requires about 28 Å and the lowest Vdd transistor in 245 requires only about 16 Å of oxide.

It will be appreciated by those skilled in the art that although the exemplary wafer 200 is shown with four thicknesses of gate oxides, the particular requirements of the final product will dictate how many different thicknesses of gate oxides are required. Additionally, although many applications will require gate oxides that correspond to generational nodes, other applications may require half-nodes or other non-standard oxide thicknesses.

Figure 3:
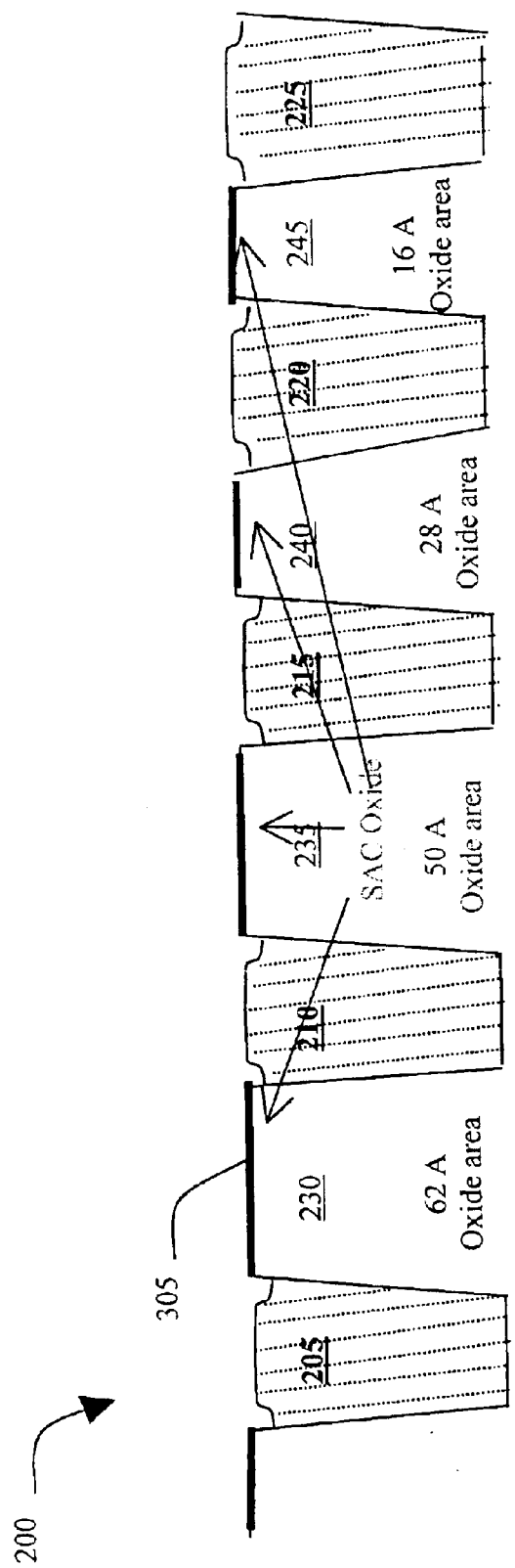
FIG. 3 is a cross-sectional view of the exemplary wafer of FIG. 2 after a sacrificial oxide has been grown.

Referring back to FIG. 1A, after the semiconductor substrate is partially fabricated, a sacrificial oxide is grown at 110. The sacrificial oxide is used to protect the semiconductor substrate from later processing steps and is only necessary to the extent the later processing steps require it. FIG. 3 is a cross-sectional view of the exemplary wafer 200 after a sacrificial oxide 305 has been grown. Standard sacrificial oxides are typically grown to be between 30 and 100 Å thick.

After the sacrificial oxide is grown at 110, a check is made to determine whether any medium gate oxide are required at 115. If the semiconductor substrate has no need for medium gate oxide, steps 120 through 130 can be skipped. Those skilled in the art will appreciate that the check can be made at any time prior to steps 120 through 130. Typically, whether medium gate oxides are present will be known well before the fabrication is started. Step 110 is shown merely for illustrative purposes in order to depict modularity of the process. In other words, the same system can be used regardless of the presence of medium gate oxide. The number of required oxides is independent to the number of oxidations.

Figure 4:
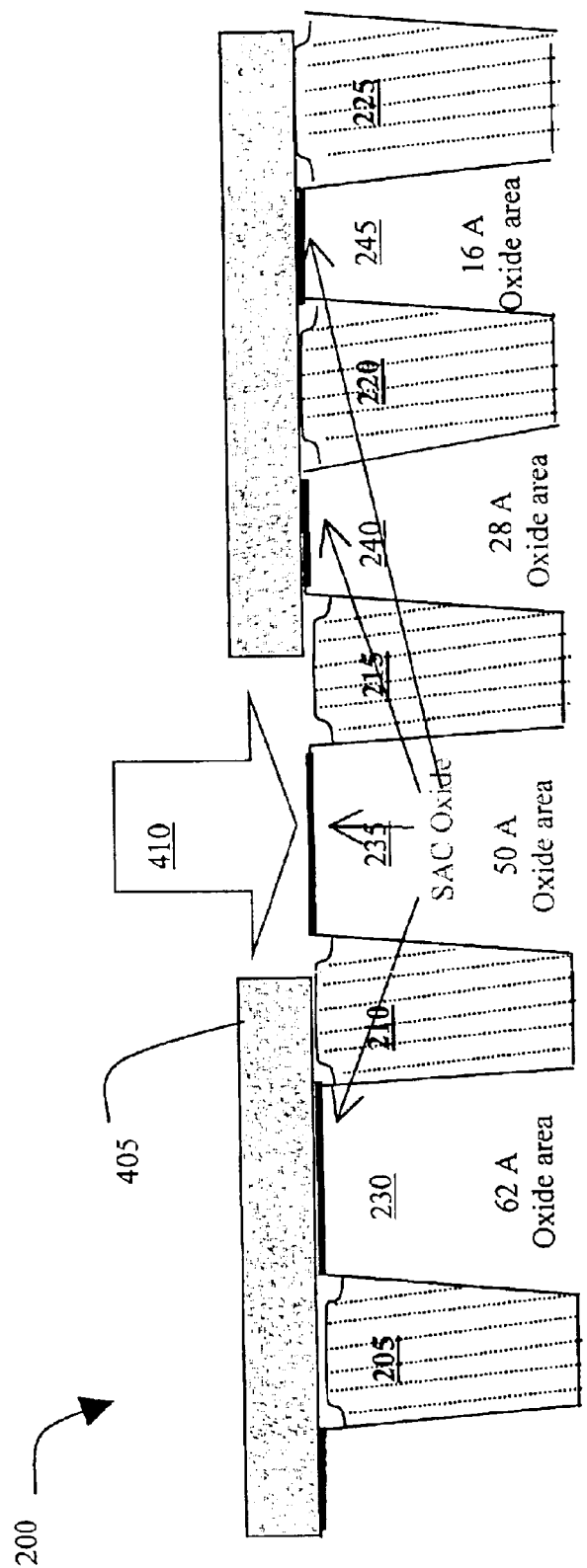
FIG. 4 is a cross sectional view of the exemplary wafer of FIG. 3 during small dose implantation.

If medium gate oxide is required a mask is deposited at 120. The mask is designed to expose only the medium-gate-oxide-to-be area on the semiconductor substrate. The medium gate oxide region is then implanted with a small dose of an oxide growth retardant at 125. FIG. 4 is a cross sectional view of the exemplary wafer 200 during small dose implantation. A mask 405 covers the thickest oxide area 230, thin gate oxide area 240 and thinnest gate oxide area 245, exposing only the medium gate oxide area 235 so that nitrogen 410 will only be implanted in area 235.

Figure 9:
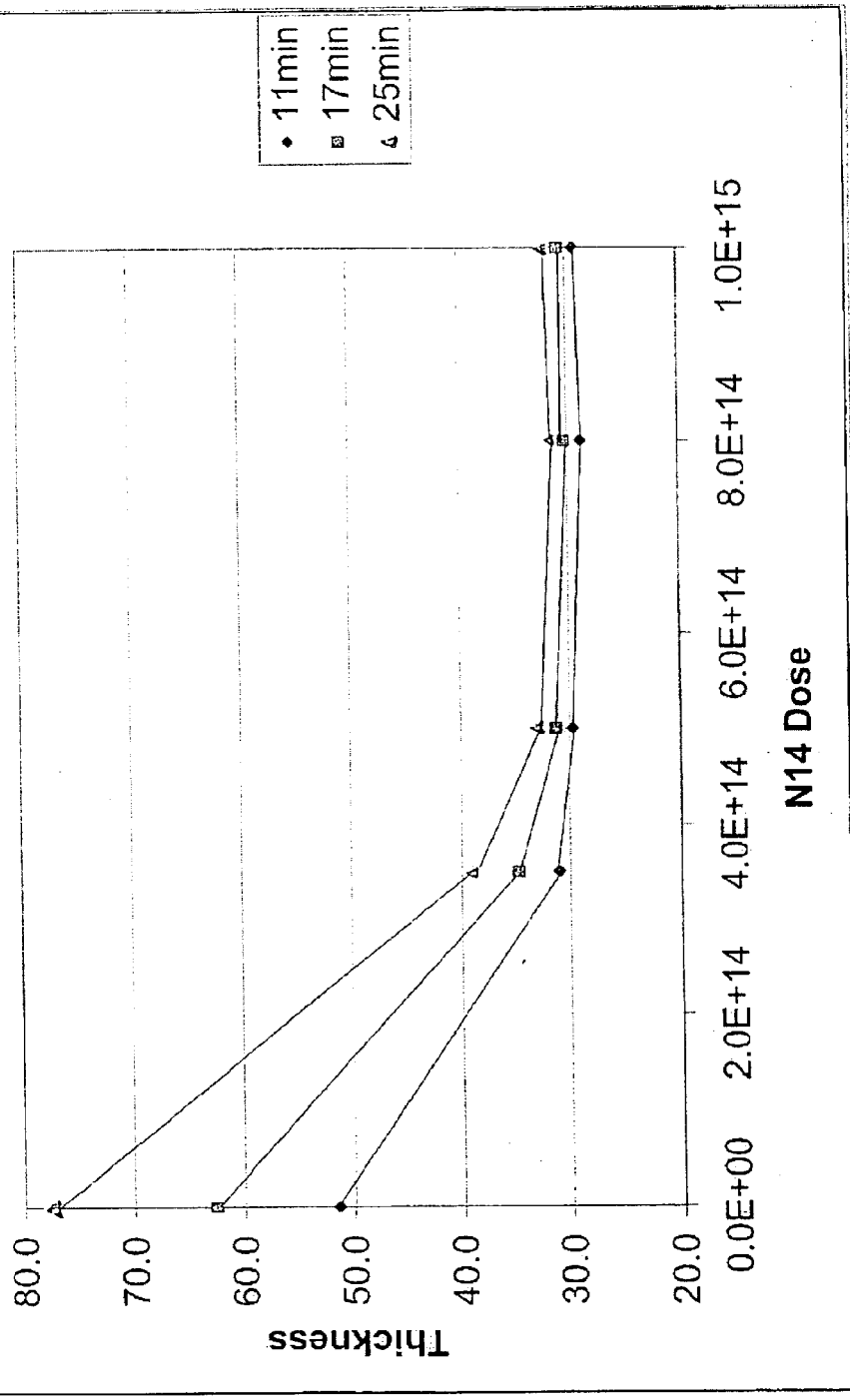
FIG. 9 is a graph showing dry oxidation vs. dose (25 KeV).

Implanting a silicon wafer with nitrogen retards oxide growth, as shown in FIG. 9. If later steps have oxidation occurring at 850° C. in a pure $O_2$ ambient environment followed by a $N_2$ anneal, then about $2 \times 10^{14}/cm^2$ of nitrogen at an energy of 25 KeV will provide a growth of about 46 Å. As will be appreciated by those skilled in the art, if oxidation or anneal parameters were changed more or less nitrogen would need to be implanted in order to grow an oxide of the same thickness.

Referring back to FIG. 1A, after implantation the mask is removed at 130. The removal can be accomplished with standard resist strip processes. For example, either a wet or dry etch clean can be used, as appropriate.

At 135 a check is made to determine whether any thin gate oxide areas are required. If the semiconductor substrate has no thin gate oxide areas, steps 140 through 150 can be skipped.

Figure 5:
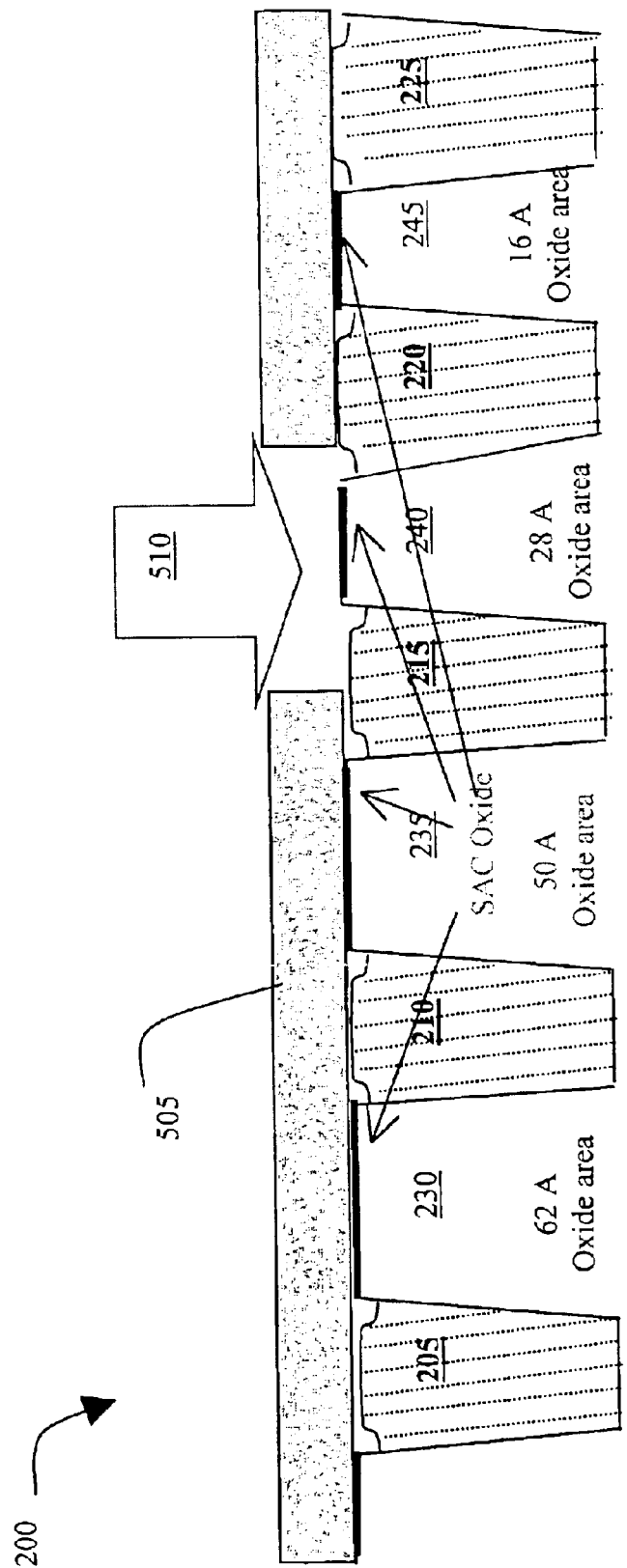
FIG. 5 is a cross sectional view of the exemplary wafer of FIG. 4 during medium dose implantation.

Otherwise, another mask is deposited at 140. This mask is designed to expose only the thin gate oxide areas on the semiconductor substrate. The areas are then implanted with an appropriate dose of an oxide growth retardant at 145. FIG. 5 is a cross sectional view of the exemplary wafer 200 during medium dose implantation. A mask 505 exposes only the thinnest gate oxide area 240 so that the correct dose of nitrogen 510 will only be implanted in that the area 240. If, for example, oxidation occurs at 850° C. in a pure $O_2$ ambient environment followed by a $N_2$ anneal, then $1 \times 10^{15}/cm^2$ of nitrogen at an energy of 25 KeV will provide a growth of 26 Å of oxide, as show in FIG. 9. After implantation the mask is removed at 150.

At 155 a check is made whether there are any other areas that need different oxides. Gate oxides representing half nodes, for example, could be implemented in steps 160, 165 and 170. Additionally, if the thinnest gate oxide could have been reliably grown to very thin thickness, appropriate implantation could occur at these steps as well. Steps 155 through 170 could be repeated for as many times as necessary for different thicknesses of oxides. It should be noted that in the exemplary wafer 200 of FIGS. 2 through 8, the thickest gate oxide area 230 and the thinnest-gate-oxide-to-be area 245 are not implanted with any nitrogen, an oxidation retardant.

Once all the areas that require an oxide growth retardant are implanted, the sacrificial oxide is stripped at 175. In the exemplary wafer 200 of FIGS. 2 through 8, a hydrofluoric acid clean, followed by an RCA clean, followed by a hydrofluoric clean would be appropriate. It is to be noted that it is preferred to keep the sacrificial oxide as thin as possible as a protection layer for masking and implant steps. The oxides that receive oxide growth retardant implant will have enhanced etch rate which is not favorable for planar topography.

Figure 6:
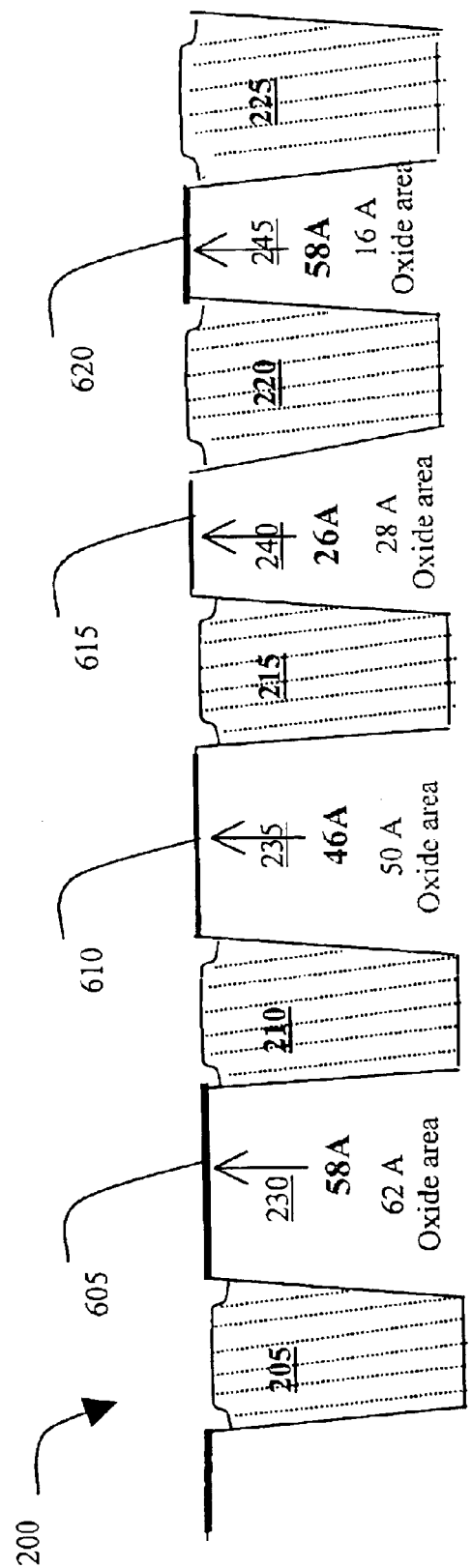
FIG. 6 is a cross sectional view of the exemplary wafer of FIG. 5 after oxide growth.

At 180 the oxides are grown. The conditions of growth are those previously contemplated when the oxide growth implantation steps were performed. FIG. 6 is a cross sectional view of the exemplary wafer 200 after oxide growth. The oxidation would have occurred at 850° C. in a pure $O_2$ ambient environment followed by a $N_2$ anneal. The two untreated areas, the area 230 and area 245, both have their oxides 605 and 620 grown at the normal unretarded rates, resulting in about 58 Å of oxide. However, the area 235 implanted with a small dose of nitrogen 410 would result in about 46 Å of oxide 610 while the area 240 implanted with a medium dose of nitrogen would result in about 26 Å of oxide 615.

Referring back to FIG. 1B, a decision is made as to whether even thinner gate oxide than in area 240 is required at 185. If all the oxides were grown to their desired final thicknesses, then the process could end. However, if thinner oxides than what can be reliably produced at 180 were required or if a modular process were being employed that contemplated such thinner oxides, then 190, 193, 196 and 199 would be performed.

Figure 7:
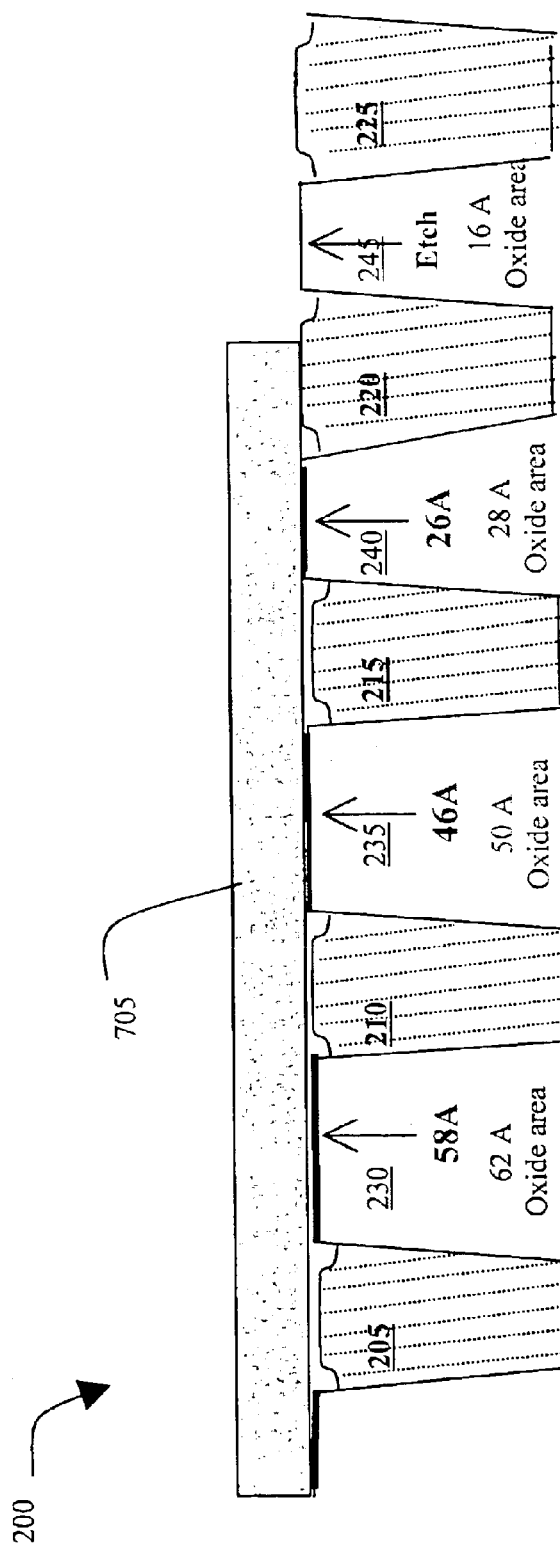
FIG. 7 is a cross sectional view of the exemplary wafer of FIG. 6 after a mask is deposited and the oxide has been removed.

At 190 a mask would expose the areas that required the thinnest gate oxides, and at 193 those areas would have their oxides removed in area 245. FIG. 7 is a cross sectional view of the exemplary wafer 200 after a mask 705 is deposited and the oxide 620 has been removed. The mask 705 protects the thick oxide 605 of 230, the medium oxide 610 of area 235 and the thin oxide 615 of the area 240.

Figure 8:
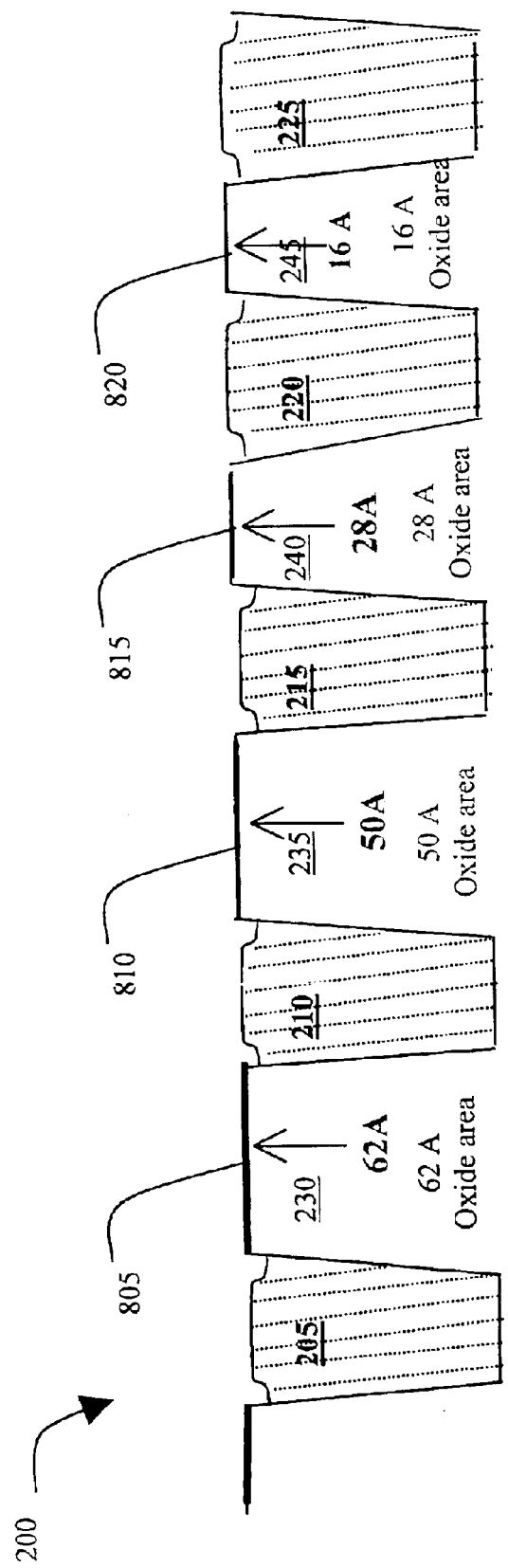
FIG. 8 is a cross sectional view of the exemplary wafer of FIG. 7 with its final oxide growths.

Once removed, a resist strip would be performed at 196. Finally, at 199 oxides would be grown again. Oxides will, of course, grow on all of the channels. Therefore, the previous oxide growth at 180 should have taken the growth at 199 into account. FIG. 8 is a cross sectional view of the exemplary wafer 200 with its final oxide growths 805, 810, 815 and 820. In order to reliably grow about 16 Å of oxide 820, the oxidation would have occurred at 800° C. in a NO ambient environment. Such an oxidation would add about 4 Å to gate oxide in area 230, making the final oxide 805 thickness about 62 Å; about 4 Å to the area 235 that received a small dose of nitrogen 410, making the final oxide 810 thickness about 50 Å; and about 2 Å to the gate oxide in area 240 that received a medium dose of nitrogen 510, making the final oxide 815 thickness about 28 Å. Alternatively, a masking step can be done to expose gate oxide of selected areas and a controlled etch can be used to thin down the exposed gate oxide to desired thickness. This will eliminate the corresponding oxidation step required to grow the thinnest gate oxide.

Although illustrative embodiments and applications of this invention are shown and described herein, many variations and modifications are possible which remain within the concept, scope, and spirit of the invention, and these variations would become clear to those of ordinary skill in the art. For example, all the oxides could be overgrown to thicknesses greater than necessary. The oxides could then be uniformly etched back to their final desired thicknesses. Alternatively, a masking step can be applied to selectively expose any of the oxide area. Then a controlled wet etch (e.g., 400:1 $H_2O$:HF) can be used to thin the exposed oxide to desired thickness. The resist strip and clean will follow. Such processes would eliminate the need for more than one oxidation step. Accordingly, the present embodiments are to be considered as illustrative and not restrictive, and the invention is not to be limited to the details given herein, but may be modified within the scope and equivalents of the appended claims.

We claim:

1. A method of growing oxides of varying thicknesses on a semiconductor substrate comprising:

implanting a first portion of the semiconductor substrate with a first dose of an oxide growth retardant;

implanting a second portion of the semiconductor substrate with a second dose of an oxide growth retardant;

oxidizing the semiconductor substrate in a first environment to grow a first oxide on the first portion and a second oxide on the second portion ensuring a third portion of the semiconductor substrate is not implanted with any oxide growth retardant;

wherein a third oxide is grown on the third portion during oxidation;

removing the third oxide from some part of the third portion of the semiconductor substrate; and oxidizing the semiconductor substrate in a second environment to grow a first additional oxide on the first portion, a second additional oxide on the second portion, and a new third oxide on the some part of the third portion.

2. The method of claim 1, wherein:

the third oxide on a remaining part of the third portion of the semiconductor substrate is not removed; and a third additional oxide is grown on the remaining part of the third portion during the second oxidation, whereby the substrate has a total of four oxide thicknesses after the second oxidation.

3. The method of claim 2 wherein:

the total oxide grown on the remaining part of the third portion is used for a thick gate oxide;

the total oxide grown on the first portion is used for a medium gate oxide;

the total oxide grown on the second portion is used for a thin gate oxide;

the new oxide grown on the some part of the third portion is used for a thinnest gate oxide.

4. The method of claim 3 wherein each gate oxide represents a gate oxide for a generational node.

5. The method of claim 3 wherein at least one gate oxide represents a gate oxide for a half generational node.

6. The method of claim 1, further comprising etching a portion of the first oxide, second oxide and third oxide.

7. The method of claim 1 wherein the oxide growth retardant is nitrogen.

8. A semiconductor wafer comprising:

a plurality of active areas formed in between adjacent isolation trenches, the active areas comprising one of at least three different gate oxides, each gate oxide having an oxide thickness appropriate to a respective transistor operating voltage;

wherein the number of oxidations that the wafer has been subjected to is less than the number of different oxide thicknesses; and wherein at least two areas of different gate oxide thickness are implanted with at least two different doses of an oxide growth retardant.

9. A method of growing oxides on a semiconductor substrate comprising:

selecting a first oxidation environment that is capable of growing a first oxide to a first thickness on the semiconductor substrate that is not implanted with any growth retardant;

determining whether oxides of a second thickness are required on a first portion of the semiconductor substrate and, if oxides of the second thickness are required, masking the semiconductor substrate so that the first portion is exposed;

implanting the first portion with a first dose of oxide growth retardant, the first dose being appropriate for the first oxidation environment and the second thickness; and removing the mask;

determining whether oxides of a third thickness are required on a second portion of the semiconductor substrate and, if oxides of the third thickness are required, masking the semiconductor substrate so that the second portion is exposed;

implanting the second portion with a second dose of oxide growth retardant, the second dose being appropriate for the first oxidation environment and the third thickness; and removing the mask;

oxidizing the semiconductor substrate at the first oxidation environment, regardless of the result of the thickness determinations, whereby three thickness of gate oxides can be created.

10. The method of claim 9, further comprising reducing the thickness of the oxides by blanket etching or selective masked etch.

11. The method of claim 9, further comprising:

determining whether oxides of a fourth thickness are required on a third portion of the semiconductor substrate and, if oxides of the fourth thickness are required, masking the semiconductor substrate so that the third portion is exposed;

removing the oxide on the third portion; and removing the mask;

oxidizing the semiconductor substrate at a second oxidation environment, regardless of the result the third thickness determination.

12. The wafer of claim 8 wherein each gate oxide represents a gate oxide for a generational node.

13. The wafer of claim 8 wherein at least one gate oxide represents a gate oxide for a half generational node.

14. The wafer of claim 8 wherein the oxide growth retardant is nitrogen.

15. The method of claim 9 wherein each gate oxide represents a gate oxide for a generational node.

16. The method of claim 9 wherein at least one gate oxide represents a gate oxide for a half generational node.

17. The method of claim 9 wherein the oxide growth retardant is nitrogen.

* * * * *